US006834612B2

(12) United States Patent
Chambers et al.

(10) Patent No.: US 6,834,612 B2
(45) Date of Patent: Dec. 28, 2004

(54) METHOD AND APPARATUS FOR MAKING PARTICLE-EMBEDDED WEBS

(75) Inventors: David C. Chambers, Ilderton (CA); Glen Connell, Pine Springs, MN (US); Ranjith Divigalpitiya, London (CA); David E. Livingstone, Harrietsville (CA); Agatona D. Monteagudo, St. Paul, MN (US); Susan C. Noe, St. Paul, MN (US); Tejmeen K. Sandhu, Tecumseh (CA)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/378,484

(22) Filed: Mar. 3, 2003

(65) Prior Publication Data

US 2003/0129302 A1 Jul. 10, 2003

Related U.S. Application Data

(62) Division of application No. 09/567,316, filed on May 9, 2000, now Pat. No. 6,569,494.

(51) Int. Cl.[7] ................................................ C23C 14/00

(52) U.S. Cl. ...................... 118/50.1; 118/620; 118/621; 118/636; 118/59; 118/308

(58) Field of Search ................................ 118/50.1, 620, 118/621, 636, 59, 308, 13, 24; 222/185.1, 189.06, 342, 410

(56) References Cited

U.S. PATENT DOCUMENTS 2,681,637 A * 6/1954 Simpson ..................... 118/308
3,268,766 A 8/1966 Amos
3,369,268 A 2/1968 Burns et al.
3,457,080 A 7/1969 Watkins (List continued on next page.)

FOREIGN PATENT DOCUMENTS

| | | | |
|---|---|---|---|
| CA | 452 052 | | 10/1948 |
| DE | 197 10 821 | A1 | 9/1998 |
| EP | 0 678 466 | A1 | 10/1995 |
| EP | 0 691 660 | A1 | 1/1996 |
| EP | 0 818 246 | A2 | 1/1998 |
| FR | 2 099 265 | | 3/1992 |
| GB | 809 332 | | 2/1959 |
| WO | WO 86/00829 | | 2/1986 |
| WO | WO 00/20526 | | 4/2000 |

*Primary Examiner*—Laura Edwards
(74) *Attorney, Agent, or Firm*—Dean M. Harts

(57) ABSTRACT

Provided is a dispenser for dispensing particles onto a surface comprising a hopper for receiving particles, wherein the hopper has an opening at its bottom, a screen having openings and located adjacent the opening of the hopper, wherein the screen openings are uniformly sized and spaced and are sufficiently large to let the largest particles pass through during dispensing yet sufficiently small to hold the particles back when the dispenser is not operating, and means, located outside of the hopper, for moving particles from the hopper through the screen, and onto the surface. Also provided is a method of making a web with embedded particles comprising the sequential steps of making the web receptive to the particles by heating, eliminating static charges present on the web, dispensing the particles onto the web, dispersing the particles to minimize particle clumping in the web, and embedding the dispensed particles in the web.

21 Claims, 5 Drawing Sheets

U.S. PATENT DOCUMENTS

| | | | | | |
|---|---|---|---|---|---|
| 3,470,417 | A | | 9/1969 | Gibbons | |
| 3,697,303 | A | | 10/1972 | Busch et al. | |
| 4,170,193 | A | * | 10/1979 | Scholes et al. | 118/627 |
| 4,655,161 | A | * | 4/1987 | Thompson | 118/24 |
| 4,737,112 | A | | 4/1988 | Jin et al. | |
| 4,779,558 | A | * | 10/1988 | Gabel et al. | 118/46 |
| 4,816,285 | A | | 3/1989 | Ribnitz | |
| 5,032,422 | A | * | 7/1991 | Lamirand et al. | 427/472 |
| 5,086,088 | A | | 2/1992 | Kitano et al. | |
| 5,087,494 | A | | 2/1992 | Calhoun et al. | |
| 5,221,417 | A | | 6/1993 | Basavanhally | |
| 5,240,761 | A | | 8/1993 | Calhoun et al. | |
| 5,300,340 | A | | 4/1994 | Calhoun et al. | |
| 5,316,197 | A | * | 5/1994 | Tobler et al. | 222/281 |
| 5,324,359 | A | | 6/1994 | Cleveland et al. | |
| 5,415,717 | A | | 5/1995 | Perneborn | |
| 5,486,427 | A | | 1/1996 | Koskenmaki et al. | |
| 5,494,981 | A | | 2/1996 | Gorodisher et al. | |
| 5,616,206 | A | | 4/1997 | Sakatsu et al. | |
| 5,709,948 | A | | 1/1998 | Perez et al. | |
| 5,817,374 | A | | 10/1998 | Detig et al. | |
| 5,851,644 | A | | 12/1998 | McArdle et al. | |
| 5,916,641 | A | | 6/1999 | McArdle et al. | |
| 5,921,400 | A | | 7/1999 | Judd | |
| 5,939,190 | A | | 8/1999 | Pfaff et al. | |
| 6,057,382 | A | | 5/2000 | Karim et al. | |
| 6,110,316 | A | * | 8/2000 | Kobayashi et al. | 156/230 |
| 6,143,374 | A | | 11/2000 | Cairncross et al. | |
| 6,197,114 | B1 | * | 3/2001 | Rodenberger | 118/623 |
| 6,569,494 | B1 | | 5/2003 | Chambers et al. | |
| 2001/0010205 | A1 | | 8/2001 | Rodenberger | |

* cited by examiner

METHOD AND APPARATUS FOR MAKING PARTICLE-EMBEDDED WEBS

CROSS REFERENCE TO RELATED APPLICATIONS

This application is a divisional of U.S. Ser. No. 09/567,316, filed May 9, 2000, now U.S. Pat. No. 6,569,494, the disclosure of which is herein incorporated by reference.

TECHNICAL FIELD

The present invention relates to embedding particles in webs. More particularly, the present invention relates to a process for embedding particles in adhesive films.

BACKGROUND OF THE INVENTION

Webs containing particles are well known. Typically these webs are films or tapes. Particle-containing films are generally made by dispersing particles into a film precursor before fashioning it into film form. The dispersion technique works well for solvent-based resins and for cross-linkable resins that have a low viscosity in their pre-crosslinked state. Issues with particle dispersion can generally be solved by selecting the processing parameters, such as film precursor viscosity and shear rates.

However, for hot-melt processed resins, particle dispersion can be difficult. If the particles are much smaller than the gaps in the processing equipment, there is little problem. For applications such as anisotropic conductive adhesives, it is not always desirable to use such small particles. Using small particles in these applications, bonding times can be long because of the time it takes for the adhesive to flow to the point where the film thickness equals the diameter of the small particles. It is advantageous to have particles that are closer in size to the adhesive film thickness. However, if the particle size approaches that of the various gaps in the processing equipment (including the compounding equipment and coating apparatus) there can be problems in mixing while maintaining particle integrity, and processing equipment damage can occur. In addition, it is sometimes desirable to have the particles protrude from the surface of the film, such as when making retroreflective films. When curable materials are used in a hot melt process, one must achieve a balance between providing a temperature high enough to yield a viscosity that enables mixing while keeping the temperature low enough to prevent premature curing.

There are known systems which place particles onto a film in a specific pattern as well as in a random pattern. Most involve a first step of separating the particles and a second step of transferring them to a web. Techniques include putting particles into pockets (Calhoun, et al. U.S. Pat. No. 5,087,494), passing particles through screens (Sakatsu, et al. U.S. Pat. No. 5,616,206), magnetic alignment with ferromagnetic particles (Jin, et al. U.S. Pat. No. 4,737,112; Basavanhally U.S. Pat. No. 5,221,417), magnetic alignment of any particle with ferromagnetic fluids (McArdle, et al. U.S. Pat. Nos. 5,851,644; 5,916,641), stretching a film with close-packed particles on it (Calhoun, et al. U.S. Pat. No. 5,240,761), and particle printing (Calhoun, et al. U.S. Pat. No. 5,300,340). Another method of transferring particles is taught in EP 0691660 by Goto et al. in which electroconductive particles are electrostatically charged to attract them to an adhering ("silicone-based sticking material") film through a screen in contact with the film. The screen (or mask) is electrically charged to attract the particles. In this case, the particles coat only those areas not screened off. The screen serves as a selective filter, allowing particles to pass through only in a pattern corresponding to the openings in the screen. The excess particles are brushed or vacuumed off of the screen. The gaps between the distributed electroconductive particles are filled with a photocurable or thermally curable resin to prevent inter-particle electrical connections. Upon curing the resin, the sticking material is stripped away with the mask from the particle filled resin to form an anisotropic electrically conductive resin. These techniques all require significant investment in equipment or various disposable or reusable parts that add cost to the resultant particle-embedded web. The present invention embodies a simpler implementation.

The particles in particle-embedded webs either control the level of adhesion of the film or provide additional utility. For example, if the particles are electrically conductive, a conductive adhesive film can be made. Conductive adhesive films can be used as layers in the assembly of electronic components, such as in attaching flex circuits to printed circuit boards and the like. Z-axis conductive adhesive films are useful in making multiple, discrete electrical interconnections in multi-layer constructions where lateral electrical isolation of the adjacent parts is required. In another example, the particles can be retroreflective, creating retroreflective films. If the particles have no inherent tackiness, the adhesion level of an adhesive web can be controlled by the level of particle loading. Also, the particles could be hollow spheres with encapsulated material, yielding a web with encapsulated material on or near the surface that becomes available upon use.

SUMMARY OF THE INVENTION

The invention is a dispenser for dispensing particles onto a surface. The dispenser includes a hopper for receiving particles. The hopper has an opening at its bottom. A screen having openings is located adjacent the opening of the hopper and a mover, located outside of the hopper, moves particles from the hopper, through the screen, and onto the surface.

The screen openings can be uniformly sized and spaced and sufficiently large to let the largest particles pass through while being dispensed yet sufficiently small to hold the particles back when the dispenser is not operating.

The mover can include a cylindrical brush covered with regularly spaced bristles. The size of the bristles can be smaller than the size of the openings of the screen, and as the bristles move over the surface of the screen, they protrude through the openings of the screen and draw particles through the screen to dispense them onto the surface. The brush is rotatable and the rotational speed is variable to vary the dispense rate of the particles. Also, the brush is movable between a first position away from the screen and a second position contacting the screen can be used.

The distance from the screen to the central longitudinal axis of the brush can be adjusted to adjust the force of the brush on the screen and the dispense rate of particles. Also, excess particles can be removed from the brush using a cleaning wire.

The invention is also a method of dispensing particles onto a surface. The method includes the steps of holding particles in a hopper. The hopper has a dispensing opening covered by a screen. The screen has openings that are uniformly sized and spaced and are sufficiently large to let the largest particles pass through while being dispensed yet sufficiently small to hold the particles back when the dispenser is not operating. The method also includes a step of rotating, outside of the hopper, a cylindrical brush covered with regularly spaced bristles that are adjacent the dispensing opening to protrude the bristles through openings of the screen and draw particles through the screen to dispense them onto the surface. The method also includes varying the dispense rate of the particles. This can be done by varying the rotation speed of the brush, adjusting the distance from the screen to the central longitudinal axis of the brush, or both.

The invention is also an apparatus for making a web with embedded particles. The apparatus can include a maker for making the web receptive to the particles; a dispenser for dispensing the particles onto the web; a disperser for dispersing the particles to minimize particle aggregation in the web and provide a substantially uniform dispersion of particles in both the longitudinal and transverse directions of the web; and an embedder for embedding the dispensed particles in the web.

The disperser can include a buffer for buffing the surface of the web after the particles are dispensed onto the web. The disperser can electrically charge the particles before they are dispensed onto the web such as by a voltage supply connected to the dispenser to charge the particles while they are in the dispenser. The disperser can also include grounding the web or charging the web with an opposite charge to that of the particles.

The apparatus can also include a static charge eliminator which eliminates static charges on the web. This can include a static bar located along the web path, ionizing the atmosphere around the web, or both.

The embedded particles on the web can be z axis conductive, retroreflective, peel adhesion controlling, abrasive, encapsulating or combinations of these.

The invention is also a method of making a web with embedded particles including making the web receptive to the particles; dispensing the particles onto the web; dispersing the particles to minimize particle clumping in the web; and embedding the dispensed particles in the web.

In this method the dispersing step can be buffing the surface of the web after the particles are dispensed onto the web; electrically charging the particles before they are dispensed onto the web; or both. The dispersing step can include grounding the web or charging the web with an opposite charge to that of the particles. The making the web receptive step can include heating. The method can also include eliminating static charges on the web using at least one of a static bar located along the web path; and ionizing the atmosphere around the web.

DETAILED DESCRIPTION

Figure 1:
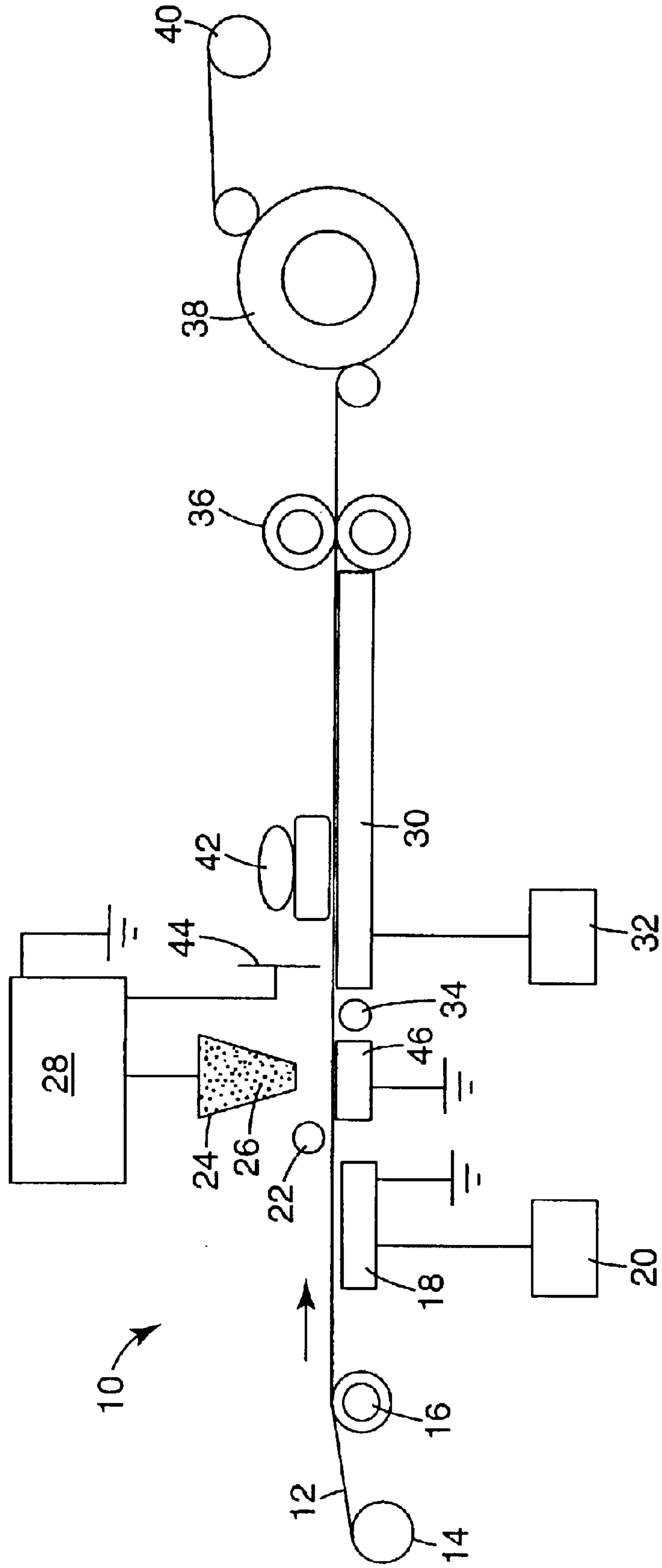
FIG. 1 is a schematic view of the apparatus of the present invention.

The invention is a method and apparatus for embedding particles in a web of material. Throughout this description, films, specifically resins in film form, will be described, although other webs, such as paper webs and webs that do not serve an adhesive function can be embedded with particles. The particles need not be spherical or regular and can be completely or partially embedded. They can be any particles that can enhance existing web properties, such as in controlling adhesion, or provide additional utility. The particles can be bare glass beads; expandable microspheres; core/shell particles; metal beads; beads made from oxides, nitrides, sulfates, or silicates such as silver oxide or boron nitride, titania, ferric oxide, silica, magnesium sulfate, calcium sulfate, or beryllium aluminum silicate; hollow glass bubbles; polymeric spheres; ceramic microspheres; magnetic particles; and microencapsulated particles, with any active fill material including releasable drugs, gases, and other materials being encapsulated. The particles can be completely or partially coated with metals, like silver, copper, nickel, gold, palladium, or platinum, or with other materials such as magnetic coating, metal oxides, and metal nitrides. Partial metal coatings can be used, for example, to make particles useful as retroreflective elements. The particles may be microporous or otherwise be designed to have high surface area, including activated carbon particles. The particles can include, within or on the particle, dyes and pigments including afterglow photo-luminescent pigments.

Exemplary particles include those commercially available under the following trade designations: "Reflective Ink 8010" from 3M, St. Paul, Minn.; "Conduct-O-Fil" from Potters Industries, Valley Forge, Pa.; "Magnapore" from Biopore Corporation, Los Gatos, Calif.; 325 mesh boron nitride from Alfa Aesar, Ward Hill, Mass.; "PLO-PLB6/7 Phosphorescent pigment" from Global Trade Alliance Inc, Scottsdale, Ariz.; "Zeospheres" or "Scotchlite" from 3M and Zeelan Industries Inc., St. Paul, Minn.; "Paraloid EXL2600" from Rohm & Haas, Philadelphia, Pa., and "Novamet Nickel Powder" from Novamet Specialty Products Corporation, Wyckoff, N.J.

The following are examples of application areas in which the invention shows utility. Conductive particles can make a conductive adhesive film which can be used as layers in assembling electronic components, such as adhering flex circuits to printed circuit boards and the like. Z-axis conductive adhesive films (ZAF), made from an adhesive film on a liner, are useful in making electrical connections in multi-layer constructions where lateral electrical isolation of the adjacent parts is required while the layers are to be electrically connected in the z-direction (perpendicular to the plane of the film). When a ZAF is used to make an electrical connection, it is desired to have a particle density of at least six particles per contact pad area. A typical minimum pad size is 0.44 $mm^2$. If the particles are chosen to have a diameter comparable to the thickness of the film, the bonding time of the ZAF is fast because less adhesive flow is required to make electrical contact between the particles and the two conductive substrates. In order to make a ZAF using the invention, the conductive particles are embedded into the film after the film has been made. The particles can be dispensed in the presence of an electric field to help distribute the particles as they randomly land on the adhesive film. The electric field creates mutual repulsion of the particles from each other and can also be used to create attraction of the particles to the film. Parts are then bonded by sandwiching the conductive film between two conductors and applying pressure and sometimes heat. Depending on the adhesive type and the size range of the particles, the bonding time, temperature, and pressure vary.

This process of manufacture contrasts with that used for known conductive adhesive films. In most known films, an adhesive precursor is blended with a sufficiently low concentration of conductive particles to assure sufficient particle dispersion to avoid making electrically conductive paths in the x-y plane in the film that is formed after the particles have been blended in. The larger the particles, the more difficult it is to disperse them sufficiently without damaging the particles or the processing equipment. Other methods involve placing the particles on a carrier film, followed by laminating this assembly to the film to be embedded, and subsequent removal of the carrier film. This adds an undesirable extra processing step. U.S. Pat. No. 5,300,340 describes a particle printing process in which the particles can be printed directly onto the final film. However, this is a contact process that results in a uniform (rather than random as in the present invention) ordered pattern. The process speed is limited, and there is no provision to avoid clumping of particles within the printed areas. One disadvantage of this is that the smallest pitch of the circuit lines in the bonded parts have to be larger than in the case of a non-clumping situation. Also, evidence of clumping of two particles means it is quite possible to have a larger cluster of particles.

In another example, the particles can have retroreflective characteristics, to create retroreflective films which are useful for highway signs and in other industries.

A third example of a particle-embedded web involves controlling peel adhesion by adding nonadhesive particles. These webs are useful in making adhesives with controlled adhesion levels.

The particles could also be hollow spheres with encapsulated material which becomes available during use. A film with microencapsulated fragrance can be used for perfume samples. A film with microencapsulated ink can be used as carbonless form paper. The particles can contain magnetic components that can be used as part of a radio frequency identification system to provide information about the item to which they are attached in an efficient, cost-effective manner.

In another example, the web material can be a silicone rubber that will thermally cure during or after embedding the web with particles. The resultant material could be useful as an electrically conductive or thermally conductive pad.

The desired amount of surface area covered by particles will vary by application, and can range from less than 1% up to a monolayer of particles covering the entire surface. The percent coverage provided by a monolayer of particles will depend upon the packing density of the particles, which is in turn related to their shape. For spherical particles, a monolayer of particles corresponds to a percent surface area coverage of approximately 78%. Applications falling within this range include retroreflective sheeting, detackified adhesive films, and z-axis conductive adhesives.

Suitable web materials include those that can be made receptive to the particles while dispensing the particles onto the web. Receptive means that the particles will remain approximately in the positions they assume immediately after being dispensed, until they can be permanently embedded in the web. The web can be a single or multiple layer construction. The web can be a layer of film or other material on top of a carrier layer. When a carrier layer is used, it can be a liner, which can be release coated. Alternatively, a continuous belt could be used as the carrier layer. The web onto which the particles are dispensed need not be continuous, and could be non-woven.

Web materials that are pressure-sensitive adhesives at room temperature can have the particles permanently embedded in the adhesive such as by running the web through a nip roller, with or without pre-heating the film. It is also possible to dispense the particles onto a web made of a liner coated with the reactive precursor of a pressure sensitive adhesive, and then to cure the precursor after the particles have been added. Thermoplastic web materials may require heating to make them receptive. If heating is used, it is desirable to keep the temperature of the web below the temperature at which the thermoplastic will flow off of the liner. Useful thermoplastic films include those designed for use as thermoplastic adhesives, also known as hot-melt adhesives. Any film material that can be cast from solvent can be cast onto a carrier, such as a liner, and have particles embedded before the loss of sufficient solvent to make the film non-receptive. Alternatively, some films may be brushed with solvent to make them receptive before dispensing the particles.

Suitable pressure sensitive adhesive materials can include acrylics, vinyl ethers, natural or synthetic rubber-based materials, poly(alpha-olefins), and silicones. Pressure sensitive adhesives, as defined in the "Glossary of Terms Used in the Pressure Sensitive Tape Industry" provided by the Pressure Sensitive Tape Council, August 1985, are well known. Exemplary pressure sensitive adhesive materials include the acrylic pressure sensitive adhesive tape available from 3M under the trade designation "Scotch® Magic™ Tape 810," and the rubber-based pressure sensitive adhesive tape available from 3M under the trade designation "Colored Paper Tape 256."

Thermoplastic materials may be amorphous or semicrystalline. Suitable thermoplastic materials include acrylics, polycarbonates, polyimides, polyphenylene ether, polyphenylene sulfide, acrylonitrile-butadiene-styrene copolymer (ABS), polyesters, ethylene vinyl acetate (EVA), polyurethanes, polyamides, block copolymers such as styrene-ethylene/butylene-styrene and polyether-block-amides, polyolefins, and derivatives of these. "Derivative" refers to a base molecule with additional substituents that are not reactive toward a crosslinking or polymerization reaction. Blends of thermoplastic materials may also be used. Tackifiers may also be included in the thermoplastic resin. Exemplary thermoplastic materials in film form include those commercially available from 3M under the trade designations "3M Thermo-Bond Film 560," "3M Thermo-Bond Film 615," "3M Thermo-Bond Film 770," and "3M Thermo-Bond Film 870," those from Adhesive Films Inc. (Pine Brook, N.J.) under the trade designations for series of films "PAF," EAF," and "UAF," and those available from Elf Atochem (Philadelphia, Pa.) under the trade designation "PEBAX 3533." Suitable tackifier resins include those available under the following trade designations: "TAMINOL 135" from Arakawa Chemical, Chicago, Ill.; "NIREZ 2040" from Arizona Chemical, Panama City, Fla.; or "PICOFYN T" from Hercules Inc., Wilmington, Del.

Thermosetting web materials can also be used. Depending upon the thermosetting material, it is possible that particles could be embedded in a material with an advanced state of cure. However, particularly if the particles cannot be embedded in partially or fully cured material, any heating to make the web receptive must be at a low enough web temperature that the particles can be embedded before the cure advances too far. Suitable thermosetting materials are those that can be made into web form while maintaining latency. Latency means that curing can be substantially prevented until the desired processing can be completed. Achieving this latency might require dark and/or cold processing conditions. Suitable thermosetting materials include epoxides, urethanes, cyanate esters, bismaleimides, phenolics, including nitrile phenolics, and combinations of these. Exemplary thermosetting materials that are commercially available in film form include those available from 3M under the trade designation "3M Scotch-Weld Structural Adhesive Film" including those having the following "AF" designations: "AF 42," "AF 111," "AF 126-2," "AF 163-2, ""AF 3109-2," "AF 191," "AF 2635," "AF 3002," "AF 3024," "AF 3030FST," "AF 10, " "AF 30," "AF 31," and "AF 32."

Hybrid materials also can be used as the web. A hybrid material is a combination of at least two components where the components are compatible in the melt phase (where the combination of the components is a liquid), the components form a interpenetrating polymer network or semi-interpenetrating polymer network, and at least one component becomes infusible (the component cannot be dissolved or melted) after curing by heating or other methods such as light. The first component can be a crosslinkable material and the second component can be (a) a thermoplastic material, or (b) monomers, oligomers, or polymers (and any required curative) which can form a thermoplastic material, or (c) a thermosetting material, i.e., monomers, oligomers, or prepolymers (and any required curative) which can form a thermosetting material. The second component is chosen so that it is not reactive with the first component. It may be desirable, however, to add a third component which may be reactive with either or both of the crosslinkable material and second component to, for example, increase the cohesive strength of the bonded hybrid material.

Suitable first components include thermosetting materials, such as those described above, as well as crosslinkable elastomers such as acrylics and urethanes. Suitable thermoplastic second components include those described above. Suitable thermoplastics, which can formed in situ, i.e., with monomers, oligomers, or polymers (and any required curative) which can form a thermoplastic material without undergoing any significant crosslinking reaction would be readily apparent. Exemplary hybrid materials incorporating a second component (a) are described, for example, in PCT/EP98/06323, U.S. Pat. No. 5,709,948, and U.S. Pat. No. 6,057,382. Exemplary hybrid materials incorporating a second component (b) are described, for example, in U.S. Pat. No. 5,086,088. Example 1 of U.S. Pat. No. 5,086,088 illustrates an example of thermoplastic material formed in situ. Suitable thermosetting second components include those described above. Exemplary hybrid materials incorporating a second component (c) are described, for example, in U.S. Pat. No. 5,494.981.

Optionally, the web material may also include additives, such as film-forming materials, intended to improve the film handling properties of the final particle-embedded web. Other examples of additives include thixotropic agents such as fumed silica; core-shell tougheners; pigments such as ferric oxide, brick dust, carbon black, and titanium oxide; fillers such as silica, magnesium sulfate, calcium sulfate, and beryllium aluminum silicate; clays such as betonite; glass beads; bubbles made from glass or phenolic resin; expandable microspheres, for example, microspheres commercially available from Expancel Inc./Akzo Nobel, Duluth, Ga., under the trade designation "Expancel DU"; anti-oxidants; UV-stabilizers; corrosion inhibitors, for example, those commercially available from W. R. Grace GmbH, Worms, Germany under the trade designation "Shieldex AC5"; reinforcing material such as unidirectional, woven, and nonwoven webs of organic and inorganic fibers such as polyester (commercially available from Technical Fibre Products, Slate Hill, N.Y. and from Reemay Inc., Old Hickory, Tenn.), polyimide, glass, polyamide such as poly (p-phenylene terephthalamide) (commercially available from E. I, duPont de Nemours and Co. Inc., Wilmington, Del. under the trade designation "Kevlar"), carbon, and ceramic. Other suitable additives include those that provide thermal or electrical conductivity such as electrically or thermally conductive particles, electrically or thermally conductive woven or non-woven webs, or electrically or thermally conductive fibers. It may also be desirable to provide additives that function as energy absorbers for such curing methods as microwave curing.

The invention uses a technique of dispensing and embedding the particles to provide a random, non-aggregating distribution. The particles are applied at a preselected density with a relatively uniform (number of particles per unit area) distribution of particles. This is accomplished without requiring any complicated screens or masks (although they can be used if desired for certain applications). An electrostatic charge can be applied to aid in the repulsion and mutual exclusion of the particles as they randomly land on the adhesive film. Also, the web can be buffed to further aid in the particle distribution.

In the system 10, shown in FIG. 1, a web 12, such as an adhesive-coated thermoplastic film, is unwound from a supply roll 14 and travels along a relatively horizontal path, although non-horizontal orientations can be used. Alternatively, the web can be supplied direct from a processing line or in any other known form. Any kind of web unwind device can be used. The web 12 can optionally pass through a pair of nip rollers (not shown), or through or over one or more driven or guide rollers 16. Next, the web 12 passes over a heated surface 18 to soften the web. A temperature sensing device, such as a thermocouple, non-contact infrared sensor, or other similar device, monitors the temperature. The temperature of the heated surface 18 can be used as an indication of the web temperature but more preferably the temperature of the web 12 itself is measured. The heated surface 18 can be governed by a controller 20. The web 12 may contact the heated surface 18, thus being heated by contact, or it can pass above the heated surface, thus being heated by convection. If the web 12 passes above the heated surface 18, static charges created by sliding contact are minimized but more energy is required to heat the web. As shown, the heated surface is an electrical heating plate.

The web 12 next passes by an optional static bar 22 to reduce static charge buildup on the web. Alternatively, ionizing air and other known static elimination devices can be used. Static can already be present on the web from the unwinding of the web or the original coating process.

Next, the web 12 passes the particle dispenser 24 which dispenses particles 26 onto the surface of the web. As shown, an optional voltage source 28 is connected to the particle dispenser 24 to charge the particles 26 before they are dispensed onto the web. The voltage source 28 supplies a voltage sufficiently high to charge the particles 26.

After the particles 26 are deposited onto the surface of the web 12, the web passes over a second heated surface 30, which is governed by a controller 32. Alternatively, a single controller can operate both heated surfaces 18, 30. In another embodiment, a single heated surface can be used. As shown, the each heated surface 18, 30 is an electrical heating plate. Alternatively, other heating devices can be used. For example, the web can pass over a cylindrical roll commonly known as a "hot can," the web can pass through an oven, or the web can pass over an infrared or induction heater. Heaters can be adjacent the top surface of the web as well as adjacent the bottom surface.

As shown in FIG. 1, the heated surface 18 is used to soften the web 12, or the coating on the web if the web is coated, making the surface tacky. This makes the web 12 receptive to the particles 26 which do not move on the web but are not yet securely fixed to the web. The heated surface 30, shown longer than the heated surface 18, is used to further heat the web 12 to drive the particles 26 into the coating. If multiple heated surfaces are used the relative lengths of the heated surfaces 18, 30 can be varied to accomplish their respective heating tasks. Alternatively, the heated surface 30 can heat the web 12 as the particles 26 are dispensed. Either at the heated surface 30 or after it, another optional static bar 34, or other static elimination device, can be used. The static bar 34, like the static bar 22, can be located over or under the web 12.

From the heated surface 30, in the illustrated embodiment the web 12 travels through a pair of nip rollers 36 which can optionally be driven. The pressure in the nip further drives the particles 26 into the web 12. One or two nip rollers can be used to embed the particles 26 into the web 12. For example, a single roller can be used over a flat plate. Any kind of roller, including silicone rubber, rubber-coated, metal, and combinations or these, can be used as long as they do not crush the particles 26 in the web 12. The nip rollers 36 can also be heated to further drive the particles 26 into the web 12. Also, by heating the nip rollers 36, the heated surface 30 can be shortened and even eliminated. After the nip rollers 36, the web 12 passes around a drive roller 38 (if the nip rollers 36 are not driven) and to a windup roller 40 at a windup station, such as with an air-clutched winder. Alternatively, the web 12 can optionally pass over a stainless steel pacer roll.

Aggregation of the particles during dispensing is an obstacle in getting a uniform distribution of particles. Particle clustering is undesirable because it creates paths leading to electrical shorts, uneven retroreflection, uneven tack, and nonuniform appearance. In the known methods used for dispensing particles onto the web, particle aggregation is a common problem. The present invention overcomes this problem. The voltage source 28 can apply a voltage to the dispenser 24 and either an opposite charge or ground can be applied to any combination of the heated surface 18 (grounding is shown), the static bar 34 (grounding is shown), and the heated surface 30. Charging the particles 26 creates an electric field between the dispenser 24 and the heated surface of the web. By imparting a charge to the particles 26, the chance of separating the particles is increased because like charges repel each other. Also, the electric field drives the particles 26 onto the web 12 with sufficient momentum to lodge them into the surface. Third, the geometry of the electric field can restrict the powder fallout beyond the web to minimize waste.

Another way to promote dispersion is to buff the surface of the web 12 after the particles are dispensed on it. For example, a random orbital sander 42 (Finishing Sander Model 505, available from Porter Cable Company, Jackson Tenn.) fitted with a soft painting pad (available under the trade designation EZ Paintr from EZ Paintr, Weston, Canada and described in U.S. Pat. No. 3,369,268) can be used to spread the powder uniformly over the adhesive. This buffer 42 is also shown in FIG. 1. The inventors have found that as the desired coverage area of the particles increases, buffing becomes a more desirable method of dispersing the particles in the film.

An electrically charged plate 44 can be placed near the dispenser 24 to contain the dispensed powder. The plate 44 may be directly connected to the high voltage power supply 28, or connected to a separate power supply (not shown). A plate 46 which is electrically grounded may be used below the web at the particles dispenser 24. The plate 46 can be electrically heated.

Figure 2:
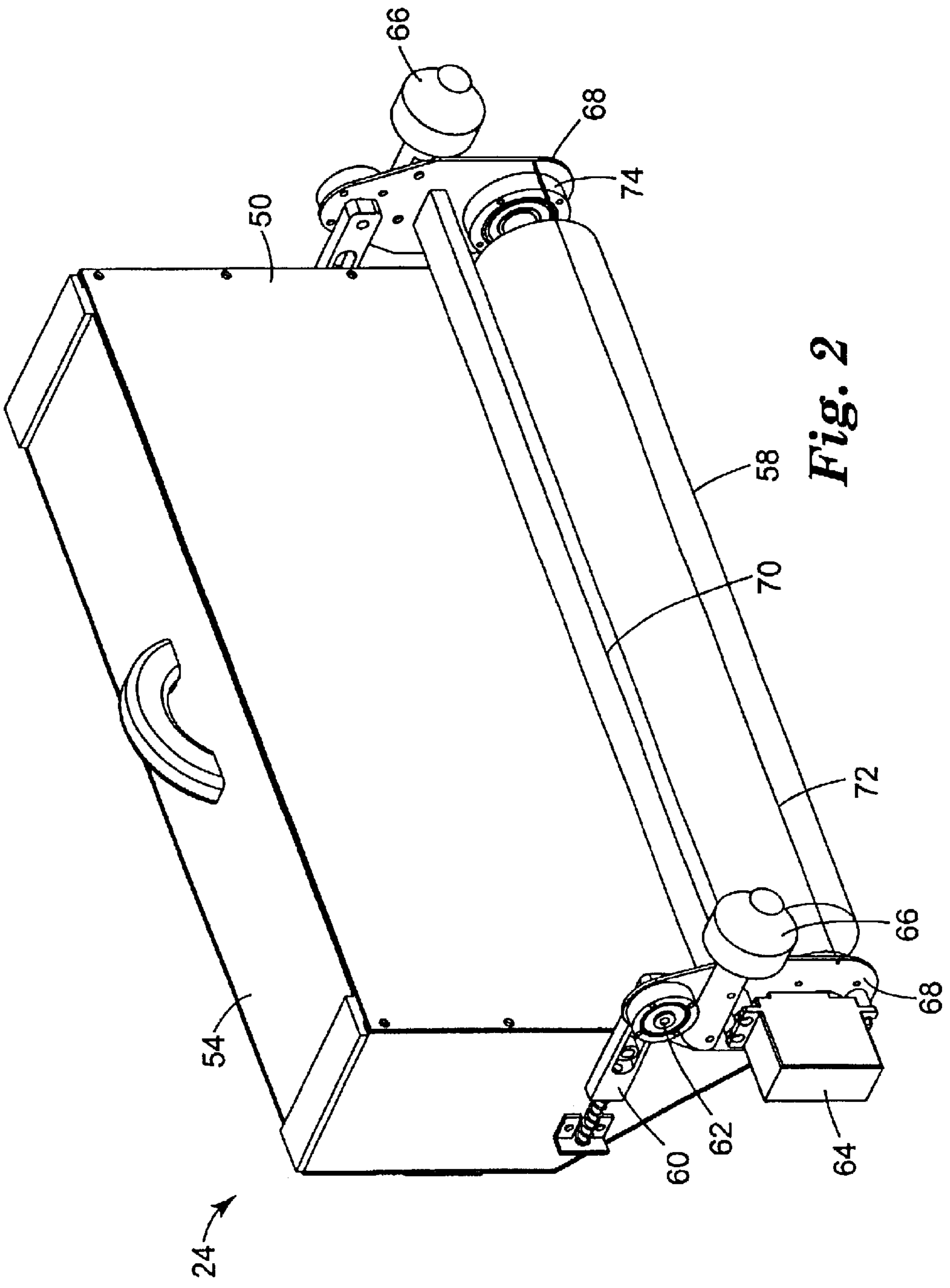
FIG. 2 is a perspective view of a feed dispenser that can be used with the apparatus of FIG. 1.
Figure 3:
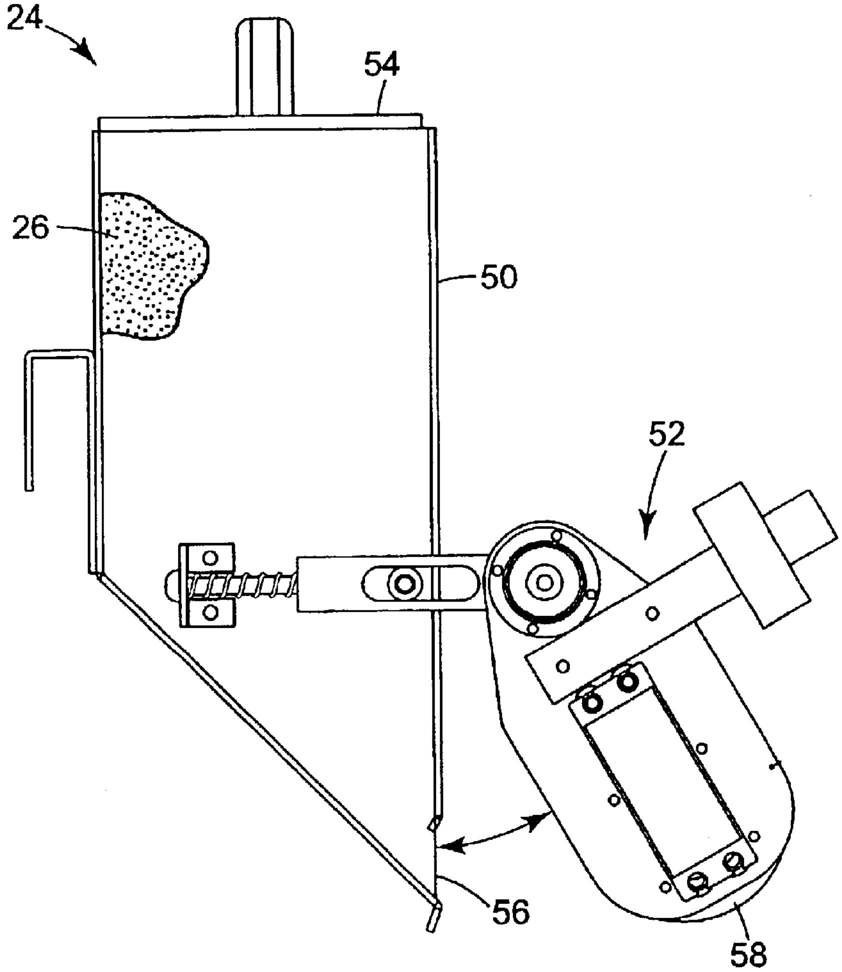
FIG. 3 is a side view of the dispenser of FIG. 2 with the cradle up.
Figure 4:
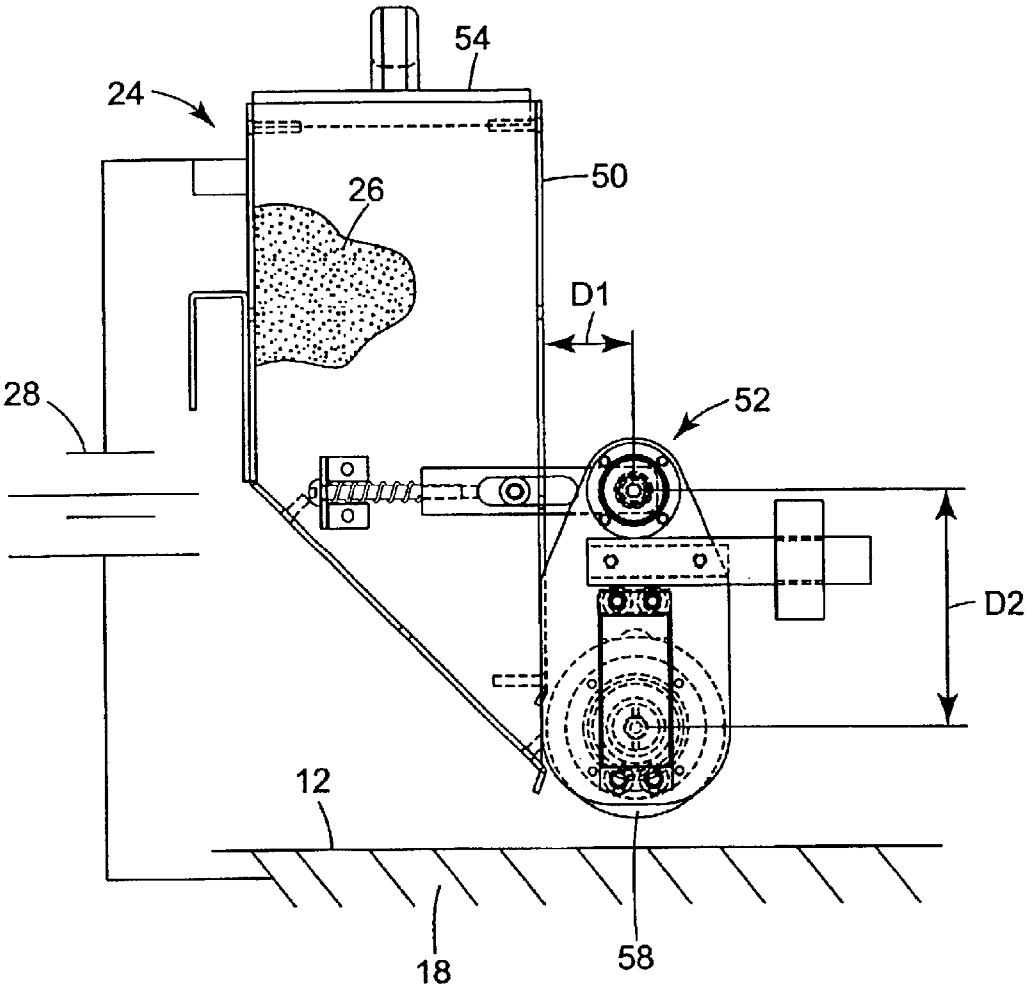
FIG. 4 is a side view of the dispenser of FIG. 2 with the cradle down.

The particle dispenser 24 can include knurled rollers, gravity-fed reservoirs, and vibratory feeders. The system 10 can operate with any of variously known dispensers. The particle dispenser 24 shown in detail in FIGS. 2–4 is a novel cradle-type dispenser. It has two main parts, a reservoir called a hopper 50, and a pivoting dispense head, called the cradle 52. The particles 26 to be dispensed are first held in the hopper 50, which can be covered by a lid 54. The hopper 50 can have an angled bottom to promote particle 26 flow to the front of the hopper. An opening on the front face at the bottom of the hopper 50 is covered with a screen 56. The screen openings should be large enough to let the largest particles 26 pass through while being dispensed but small enough to hold the particles back when the dispenser 24 is not operating. In one embodiment, the particles 26 have a mean size of 43 μm and the screen 56 has 80 μm openings but the openings can be 65 to 105 μm (1.5 to 2.5 times the mean particle diameter) or 75 to 86 μm (1.75 to 2 times the mean particle diameter). The screen 56 should have consistent opening size and spacing to ensure even dispensing of particles 26 across the web 12. The screen can be a polyester or metal screen of the type typically used in the screen printing industry. In this embodiment, the screen is a monofilament polyester, PW −180×55 screen manufactured by Saati America's Majestic Division, Somers N.Y.

The cradle 52 includes a dispensing brush 58, adjustable cradle mounts 60, pivot points 62, a geared drive motor 64, counterweights 66, end plates 68, a support bar 70, a cleaning wire 72, and drive bearings 74. The dispensing brush 58 can be cylindrical with ends that permit it to be mounted in the drive bearings 74 and coupled to the drive motor 64. The surface of the brush 58 is covered with very fine, regularly spaced bristles of sufficiently small diameter to extend through the openings in the screen 56. The bristles can be made of polyamide resin or coated with graphite to improve conductivity. The bristles on the brush 58 in this embodiment are nylon, 26 μm in diameter and have a mean length of 0.368 cm (0.145 in). They are arranged in rows of 30.5 tufts/cm (12 tufts/in) with approximately 70 bristles per tuft and 56 rows/cm (22 rows/in) manufactured onto a 0.038 cm (0.015 in) polyester fabric backing by Collins & Aikmen Company, New York, N.Y. If the bristles are not spaced evenly or are laid out with irregular patterns, these patterns will be transferred to the web as the particles are dispensed. Thus, the brush 58 should have a flat surface and be true so that it contacts the screen evenly across the entire length of the dispenser 24 throughout it rotation. If the brush 58 does not contact the screen evenly, the dispense rate of the particles across the web will vary. Alternatively, the brush can have other configurations. Also, alternatives to the brush can be used, as described below.

The brush 58 is mounted with sealed drive bearings 74 (bushings can be used) to ensure true rotation. The geared d.c. drive motor 64 (or any equivalent device, which can rotate the brush) rotates the brush 58 and controls the rotational speed of the brush by varying the voltage applied to the motor. This determines the dispense rate of the particles. Any other method and device for varying the rotation of the brush can be used. The drive bearings 74, drive motor 64, counterweights 66, and pivot points 62 are mounted to and held together by the end plates 68. The pivot points 62 are sealed bearings to ensure low friction swinging of the cradle 52.

As shown in FIGS. 3 and 4, the entire cradle assembly can pivot freely on the pivot points 62 from the up position (FIG. 3) downwardly until the brush 58 touches the screen 56 (FIG. 4). The cradle 52 is supported at the pivot points 62 by the adjustable cradle mounts 60. In one embodiment, the end plates 68 are structurally bound together by a support bar 70 which makes the ends of the cradle 52 move together to maintain alignment of the brush 58 with the screen 56. In this embodiment, the brush 58 must be precisely aligned with the screen 56 using the adjustable cradle mounts 60. In another embodiment, the end plates are not mounted to adjustable cradle supports but to the support bar which is also able to pivot around its center allowing the brush to move freely and self-align with the screen. The cradle assembly can be pivoted manually or using any known system.

The cradle mounts 60 are adjusted so that the distance, D1, from the screen 56 to the central longitudinal axis of the brush 58 equals the radius of the brush. This ensures that when the cradle 52 is free hanging (without the counterweights 66) the brush surface touches the screen and does not significantly influence the force exerted against the screen. The counterweights 66, which are mounted off-axis at the front of the cradle 52, determine the force with which the brush 58 pushes against the screen 56. This force maintains intimate contact between the brush and screen during rotation and influences the dispense rate. The counterweights 66 can be moved further or closer to the pivot axis between the pivot points 62 on threaded rods to adjust the brush pressure. Alternatively, other known biasing devices can be used. In this embodiment, the dispenser used a pressure of 0.661 kg/linear meter (0.037 lb/linear inch) and had a range of 0.536 to 0.929 kg/linear meter (0.030 to 0.052 lb/linear inch), although other pressures can be used.

The distance, D2, between the pivot axis and the central longitudinal axis of the brush should be equal to the vertical distance from the pivot axis to the center height of the screen to ensure that the brush 58 contacts the screen and not the metal hopper face above or below the screen. A cleaner can remove excess particles from the brush. As shown, the cleaner is a cleaning wire 72, tensioned between the end plates 68 on the front side of the brush 58 so that the wire just contacts the tips of the bristles. As the brush 58 turns and rubs against the cleaning wire 72, any excess particles 26 on the brush are removed to prevent buildup of particles on the brush and possible aggregation of particles on the web 12.

The dispenser 24 is suspended above the web 12 at a distance close enough to reduce the effects of air currents on the dispense pattern. This distance can be 3 cm from the cleaning wire 72 to the web 12. The hopper 50 is filled with the particles 26 to be dispensed and the lid 54 keeps out contaminants. The voltage is applied to the hopper to charge the particles 26. The drive motor 64 rotates the brush 58 so that the bristles move down across the surface of the screen 56. As the bristles move over the surface of the screen, they protrude through the openings of the screen and draw particles through to the outside, dispensing them onto the web 12. Any particles 26 that remain on the surface of the brush are cleaned off by the cleaning wire 72. The particles that are cleaned off the brush by the cleaning wire fall on to the web forming a second dispense zone. Because the two dispense zones are independent, they tend to further even out particle dispersion.

The dispense rate for a given particle size is affected by the screen opening size, the brush rotational speed, the brush-to-screen pressure, the screen tension, and the proper adjustment of the distance D1. The dispense rate increases as the screen opening size increases, as the brush rotational speed increases, as the screen tension decreases, and as the brush-to-screen pressure increases. As the distance D1 increases, the dispense rate decreases.

The uniformity of coating weight across the web and dispersion of particles on the web are affected by brush-to-screen alignment, brush cleanliness, brush surface regularity and voltage in the following ways. Misaligning the brush and screen will cause heavier dispensing where the brush first touches the screen. Contaminated areas on the brush surface and areas on the brush surface that have less bristle density will decrease the dispense rate at those areas. Without the voltage source, particle dispersion decreases and aggregation increases.

In an alternative embodiment, the brush can be replaced by a knurled roller, such as used in printing industry. In another alternative embodiment, the screen is placed horizontally at the bottom of a hopper 50 and a brush is placed in contact with the screen. The powder in the hopper 50 dispenses as the brush rotates in contact with the screen by dragging the particles through the screen. Because this can lead to powder build up and impaction at the base of the bristles which eventually falls out in clumps onto the web, another screen can be placed horizontally at the bottom of the device to contact the brush as well. The second screen is below the brush and can assist in reducing aggregation if particles by breaking the clumps as they are forced through the bottom screen.

In another embodiment, a vibratory dispenser can be used to dispense powder. By modifying the path to make it resistant to the flow of the powder in the vibratory dispenser, the dispense rate can be moderated. In one version, the path of the powder in the dispenser is modified by attaching a "hook" material (such as can be found in known hook and loop fasteners) in the path of the powder flow. This slows the dispense rate due to the restriction posed by the hooks to the flow of powder. The dispense rate can be moderated by using various grades of the hook material. Various microstructured surfaces could be used in the place of the hook material to modify the flow of particles. A linear relationship between the operating a.c. voltage of the vibratory dispenser and the powder dispense rate was established for a given flow medium.

Figure 5:
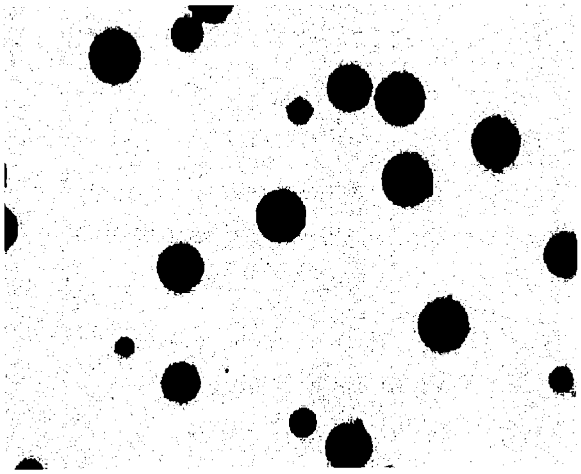
FIG. 5 is a micrograph showing silver-coated glass beads embedded onto a thermoplastic adhesive. The sample area is 420 $\mu$m×570 $\mu$m.

One advantage of the invention is that it simplifies the manufacturing process by eliminating the problem of particle aggregation. This is particularly advantageous when embedding conductive particles. FIG. 5 is a micrograph showing silver coated glass beads embedded onto a thermoplastic adhesive. The sample area is 420 $\mu$m×570 $\mu$m. An ancillary benefit to this more uniform particle distribution is that it provides a uniform appearance in the finished product.

An advantage of using the inventive method to make z-axis conductive adhesive films is that it allows the use of large conductive particles. Because the size of the particles can be very similar to the thickness of the adhesive film, and because the particles span the thickness of the adhesive, the amount of material flow to make a bond is minimal, especially when compared to known thermoplastic-film based systems in which the particles are small compared to the thickness of the adhesive. This allows quick bonding of the conductive surface. This also ensures that the thickness of the final bond is uniform over a large part. This can help maintain the quality of a final product.

Another advantage of a z-axis conductive adhesive film made via the inventive process is that the embedded-particle film product can be based on thermoplastic adhesive. The tack of the adhesive can be reactivated by heating. This can be done as many times as needed. Freedom to reactivate the adhesive is useful in applications where the bonded parts have to be reworked, removed, repaired, or repositioned.

Test Methods

Peel Adhesion Strength

Peel adhesion strength to a glass substrate was measured. An IMASS Tester, Model 3M90 (available from IMASS Instrumentors, Incorporated, Strongville, Ohio) was used to measure the 180° angle peel adhesion strength as follows. First, the glass plate test surface of the peel tester was cleaned using methyl ethyl ketone and KIMWIPES EX-L tissues (available from Kimberly-Clark Corporation, Roswell, Ga.). Next, a sample having a width of 1.9 cm (0.75 in) and a length of 25.4 cm (10.0 in) was placed lengthwise on the glass plate. The sample was secured to the glass substrate by passing a 2.27 kg (5 lb) rubber roller back and forth over the sample three times. Next, the sensor arm was extended lengthwise over the sample and the end furthest from the arm holder was attached to the sample. The opposite end of the sensor arm was then positioned in the arm holder and the tester was activated. The sample was peeled from the glass substrate at an angle of 180° and a rate of 229 cm/min (90 in/min).

The first 2 seconds of data were not included in the analysis, to accommodate the startup of the test. The data taken between 2 and 5 seconds was analyzed for the average peel force, converted to a peel adhesion strength value, and normalized to a width of 2.5 cm (1 in). Four samples were measured and the results used to calculate the reported overall average peel adhesion strength (in gm/cm (oz/in)) and standard deviation.

Surface Area Coverage

The surface area covered by embedded particles was evaluated using a microscope. Articles having embedded particles on their surface were examined at 20× magnification using an OLYMPUS BX60 F5 (available from Olympus Optical Company, Ltd., Japan) microscope equipped with a video camera. A picture was taken at 366× magnification of a randomly selected area and the image stored in a digital format for later manipulation. Six images, each having an area of 0.24 mm, were analyzed using SIGMASCAN PRO 5 image processing software (available from SPSS, Incorporated, Chicago, Ill.) to obtain a particle count in each of six randomly selected areas and an average particle count was calculated. The percentage of surface area covered was determined by multiplying the average cross-sectional area of a particle (obtained from the average particle size provided by the manufacturer) by the average total particle count in an imaged area, and dividing this number by the total area of the image. This number is multiplied by 100 to obtain the percentage.

Electrical Resistivity

Articles having electrically conductive particles were evaluated for electrical resistance both through the thickness of the article (z axis) and across its surface (x-y plane, also referred to as "sheet resistance"). More specifically, for z axis resistivity, a film sample, having a width of about 15.2 cm (6 in) and a length of about 25.4 cm (10 in), was placed between two circular brass plates 0.318 cm (0.125 in) thick and having a diameter of 2.5 cm (1 in). The electrodes of a FLUKE 83 III Multimeter (available from FLUKE Corporation, Everett, Wash.) were attached to the brass plates which were then pressed together using finger pressure. The z axis resistance was recorded in ohms.

The x-y plane (sheet) resistance of a sample having the dimensions above was measured using a PROSTAT Surface Resistance & Resistivity Indicator, Model PSI-870 (PROSTAT Corporation, Bensenville, Ill.) by following the procedure described in the operations manual. The x-y plane resistance was recorded in ohms/square (also written as ohms/).

Retroreflectivity

Retroreflectivity of the coated samples were measured using a Field Retroreflectometer Model 920 available from Advanced Retro Technology Inc., Spring Valley, Calif. The retroreflectivity is expressed in candles per lux per square meter (cd/lx/$m^2$). First, the instrument was calibrated using a standard sample provided by the manufacturer (Engineering White) by placing the instrument over the sample (such that its optical window fits the samples) and reading the digital display on the instrument. The calibration knob was adjusted until the instrument read 101.0 cd/lx/$m^2$. Then the instrument was placed over the sample to be measured in the same way and the retroreflectivity was provided. Three areas of the coated samples, 10 cm (4 in) apart from each other, were measured and averaged before reporting.

EXAMPLES

In the examples below, various coated webs were embedded with particles using the apparatus of FIGS. 1-4. For some of the examples, dispensing was conducted in conjunction with buffing, electrostatic charging, or both. All of the examples were performed in a humidity-controlled environment. Typical relative humidity inside the apparatus was kept below 10% and the ambient temperature around 30° C.

Example 1

A sample of Scotch® Magic™ Tape 810 (an acrylic pressure sensitive adhesive tape) measuring 1.9 cm (0.75 in) wide and 25.4 cm (10 in) long was embedded on the adhesive surface with uncoated Conduct-O-Fil™ S-3000-S3P glass beads (an intermediate in the production of metal coated glass beads), available from Potters Industries, having an average particle diameter of 43 μm. The dispenser used was similar to that shown in FIGS. 2–4 and various surface area coverages were used. The following parameters were used: a web speed of 6.1 m/min (20 ft/min), electrically grounded heating plate temperature of about 20-25° C., a distance of 30 mm between the charging wire on the brush and the heating plate, an operating voltage of 0.4 V for rotating the brush, and a negative d.c. potential of 7 kV applied to the dispensing apparatus. The screen was kept taut by stretching it manually over the dispenser opening until there was no appreciable slack when pressed with a finger. The resulting particle embedded article was evaluated for surface area coverage and peel adhesion strength as described in the "Test Methods" above. The results are reported in Table 1 below.

Example 2

Example 1 was repeated with a web speed of 9.1 n/min (30 ft/min). The resulting particle embedded article was evaluated for surface area coverage and peel adhesion strength as described in the "Test Methods" above. The results are reported in Table 1 below.

Example 3

Example 1 was repeated with a web speed of 12.2 m/min (40 ft/min). The resulting particle embedded article was evaluated for surface area coverage and peel adhesion strength as described in the "Test Methods" above. The results are reported in Table 1 below.

Comparative Example

A sample of Scotch® Magic™ Tape 810 was evaluated for surface area coverage and peel adhesion strength as described in the "Test Methods" above. The results are reported in Table 1 below.

TABLE 1

| Ex. | Substrate Type | Particle Type | Dispensing Method | % Surface Area Covered | Peel Adhesion Strength gm/cm (oz/in) |
|---|---|---|---|---|---|
| 1 | acrylic PSA tape | Uncoated glass beads | Dispensing and electrostatic charging | 40 | 0 (Completely Detackified) |
| 2 | Same | Same | Same | 9 | 3.3 ± 1.1 (0.3 ± 0.1) |
| 3 | Same | Same | Same | 1 | 33.5 ± 11.1 (3 ± 1) |
| CE | Same | None | None | 0 | 256.7 ± 122.8 (23 ± 11) |

CE = Comparative Example

Example 4

A 1:1 (by weight) blend of a resin material having the trade designation PEBAX 3533 (a polyamide-polyether block copolymer, available from Elf Atochem, North America, Philadelphia, Pa.) and a resin material having the trade designation NIREZ 2040 (a terpene phenolic, available from Arizona Chemical Corporation) was extruded onto a 0.002 in thick silicone-coated polyester film to provide a thermoplastic film having a thickness of 0.0025 in on the release liner.

The thermoplastic film was embedded with conductive silver-coated glass beads, S-3000-S3P (available from Potters Industries) having an average particle diameter of 43 μm by passing the thermoplastic film on the release liner through the dispensing apparatus similar to that described in Example 1. The following parameters were used: a web speed of 6.1 m/min (20 ft/min), a heating plate temperature of 85° C. (maintained using a Temperature Controller Model 89810-02, available from Cole-Parmer Instrument Company, Vernon Hills, Ill.), a distance of 30 mm between the charging wire on the brush and the heating plate, and an operating voltage of 0.4 V for rotating the brush. The screen was kept taut by stretching it manually over the dispenser opening until there was no appreciable slack when pressed with a finger. The coated web was sent through the nip of two silicone rubber rolls. The resulting particle embedded article was evaluated for surface area coverage and resistivity as described in the "Test Methods" above. The results are reported in Table 2 below.

Example 5

Example 4 was repeated with a negative d.c. potential of 7 kV applied to the dispensing apparatus, and with the heating plate grounded. The resulting particle embedded article was evaluated for surface area coverage and resistivity as described in the "Test Methods" above. The results are reported in Table 2 below.

Example 6

Example 5 was repeated with the particle-embedded thermoplastic film buffed on the particle-containing surface using a finishing sander (Model 505, available from Porter Cable Jackson, Tenn.) equipped with an EZ Paintr® pad. The buffing occurred 7.5 cm (3 in) away form the powder dispensing area of the web. The resulting particle embedded article was evaluated for surface area coverage and resistivity as described in the "Test Methods" above. The results are reported in Table 2 below.

TABLE 2

| Ex. | Substrate Type | Particle Type | Dispensing Method | % Surface Area Covered | Resistivity |
|---|---|---|---|---|---|
| 4 | Thermoplastic resin | Siver-coated Glass Beads | Dispersing | 4 | z axis: 0.5 ohms<br>x-y plane: $10^{11}$ ohms/ |
| 5 | Same | Same | Dispensing & electrostatic charging | 17 | z axis: 0.4 ohms<br>x-y plane: $10^{11}$ ohms/ |
| 6 | Same | Same | Dispensing & electrostatic charging & buffing | 48 | z axis: 0.4 ohms<br>x-y plane: $10^{11}$ ohms/ |

Example 7

A rubber adhesive-based tape was embedded with reflective particles and evaluated for retroreflectivity. (Retroreflectivity is a special case of reflectivity; it describes reflection of incident light back at an angle of 180°. Specifically, 3M™ Colored Paper Tape 256 (a printable flatback paper tape) was embedded on the adhesive surface with glass beads hemispherically coated with aluminum (available as Component B of 3M™ Reflective Ink 8010) using the apparatus and parameters described in Example 1 with the following modification. The operating voltage for rotating the brush was 1.5 V. The resulting particle embedded article was evaluated for surface area coverage and retroreflectivity as described in the "Test Methods" above. The results are reported in Table 3 below.

Example 8

Example 7 was repeated with an operating voltage for rotating the brush of 3.0 V. The resulting particle embedded article was evaluated for surface area coverage and retroreflectivity as described in the "Test Methods" above. The results are reported in Table 3 below.

Example 9

Example 7 was repeated with an operating voltage for rotating the brush of 6.0 V. The resulting particle embedded article was evaluated for surface area coverage and retroreflectivity as described in the "Test Methods" above. The results are reported in Table 3 below.

Example 10

Example 9 was repeated with 3M™ Structural Bonding Tape 9245 (a heat curable, epoxy/acrylic hybrid pressure sensitive adhesive tape) used in place of 3M™ Colored Paper Tape 256. The resulting particle embedded article was evaluated for surface area coverage and retroreflectivity as described in the "Test Methods" above. The results are reported in Table 3 below.

TABLE 3

| Ex. | Substrate Type | Particle Type | Dispensing Method | % Surface Area Covered | Retroreflectivity (cd/lx/$m^2$) |
|---|---|---|---|---|---|
| 7 | Rubber adhesive type | aluminum coated glass beads | Dispensing & electrostatic charging | 14 | 16.2 ± 4.4 |
| 8 | Same | Same | Same | 33 | 36.8 ± 16.6 |
| 9 | Same | Same | Same | 50 | 60.5 ± 30.1 |
| 10 | Hybrid PSA tape | Same | Same | 60 | 66.4 ± 35.4 |

Various changes and modifications can be made in the invention without departing from the scope or spirit of the invention. All cited materials are incorporated into this disclosure by reference.

What is claimed is:

1. A dispenser for dispensing particles onto a surface comprising:

a hopper for receiving particles, wherein the hopper has an opening at its bottom;

a screen having openings and located adjacent the opening of the hopper, wherein the screen openings are uniformly sized and spaced and are sufficiently large to let the largest particles pass through while being dispensed yet sufficiently small to hold the particles back when the dispenser is not operating; and means, located outside of the hopper, for moving particles from the hopper through the screen, and onto the surface, wherein the screen is located between the hopper and the means for moving particles.

2. The dispenser of claim 1 wherein the means for moving particles comprises a rotatable brush covered with bristles, located outside of the hopper, wherein the size of the bristles is smaller than the size of the openings of the screen, and wherein as the bristles move over the surface of the screen, they protrude through the openings of the screen and draw particles through the screen to dispense them onto the surface.

3. The dispenser of claim 2 wherein the brush is cylindrical and the bristles are regularly spaced.

4. The dispenser of claim 2 wherein the brush is movable between a first position away from the screen and a second position contacting the screen.

5. The dispenser of claim 2 further comprising a cleaner which removes excess particles from the brush, optionally wherein the cleaner comprises a cleaning wire.

6. The dispenser of claim 2, further comprising a drive motor coupled to the brush.

7. The dispenser of claim 2, further comprising a biasing device connected to the brush capable of forcing the brush against the screen.

8. An apparatus for making a web with embedded particles comprising:

means for making the web receptive to the particles including a heat source;

a dispenser according to claim 1 for dispensing the particles onto the web;

means for eliminating static charges present on the web;

means for dispersing the particles to minimize particle aggregation in the web and provide a substantially uniform dispersion of particles in both the longitudinal and transverse directions of the web; and means for embedding the dispensed particles in the web.

9. The apparatus of claim 8 wherein the means for dispersing comprises buffing the surface of the web after the particles are dispensed onto the web.

10. The apparatus of claim 8 wherein the means for dispersing comprises: a voltage supply connected to the means for dispensing to electric ally charge the particles while they are in the dispenser; and at least one of grounding the web and charging the web with an opposite charge to that of the particles.

11. The apparatus of claim 8 wherein the means for eliminating static charges on the web comprise at least one of: a static bar located along the web path; and ionizing the atmosphere around the web.

12. The apparatus of claim 8 wherein the means for embedding comprises a source of heat and/or a source of pressure, optionally wherein the source of pressure comprises nip rollers through which the web passes.

13. A dispenser for dispensing particles onto a surface comprising:

a hopper for receiving particles, wherein the hopper has an opening at its bottom;

a screen having openings and located adjacent the opening of the hopper, wherein the screen openings are uniformly sized and spaced and are sufficiently large to let the largest particles pass through while being dispensed yet sufficiently small to hold the particles hack when the dispenser is not operating;

a rotatable brush covered with bristles, located outside of the hopper, wherein the size of the bristles is smaller than the size of the openings of the screen, and wherein as the bristles move over the surface of the screen, they protrude through the openings of the screen and draw particles through the screen to dispense them onto the surface; and a biasing device connected to the brush capable of forcing the brush against the screen.

14. The dispenser of claim 13 wherein the brush is cylindrical and the bristles are regularly spaced.

15. The dispenser of claim 13 wherein the brush is movable between first position away from the screen and a second position contacting the screen.

16. The dispenser of claim 13 further comprising a cleaner which remove excess particles from the brush, optionally wherein the cleaner comprises a cleaning wire.

17. An apparatus for making a web with embedded particles comprising:

a dispenser according to claim 13 for dispensing the particles onto the web; and means for eliminating static charges present on the web.

18. The apparatus of claim 17 further comprising means for dispersing the particles to minimize particle aggregation in the web and provide a substantially uniform dispersion of particles in both the longitudinal and transverse directions of the web.

19. The apparatus of claim 18 wherein the means for dispersing comprises: a voltage supply connected to the dispenser to electrically charge the particles while they are in the dispenser; and at least one of grounding the web and charging the web with an opposite charge to that of the particles.

20. The apparatus of claim 17 further comprising means for embedding the dispensed particles in the web.

21. The apparatus of claim 20 wherein the means for embedding comprises a source of heat and/or a source of pressure, optionally wherein the source of pressure comprises nip rollers through which the web passes.

* * * * *

UNITED STATES PATENT AND TRADEMARK OFFICE

CERTIFICATE OF CORRECTION

PATENT NO. : 6,834,612 B2
APPLICATION NO. : 10/378484
DATED : December 28, 2004
INVENTOR(S) : David C. Chambers It is certified that error appears in the above-identified patent and that said Letters Patent is hereby corrected as shown below:

Column 8
Line 7, after “can” insert --be--
Line 18, after “of” insert --a--
Line 22, delete “5,494.981” and insert --5,494,981--

Column 14
Line 52, delete “0.24 mm” and insert --0.24 $mm^2$ --

Column 16
Line 26, delete “9.1 n/min” and insert --9.1 m/min--

Column 17
Table 2, Row 1 (excluding heading), delete “Siver” and insert --Silver--
Table 2, Row 1 (excluding heading), delete “Dispersing” and insert --Dispensing--

Column 20
Line 23, delete “electric ally” and insert --electrically--
Line 44, delete “hack” and insert --back--
Line 58, after “between” insert --a--
Line 61, delete “remove” and insert --removes--

Signed and Sealed this

Twelfth Day of February, 2008

JON W. DUDAS
*Director of the United States Patent and Trademark Office*